United States Patent
Yen

(10) Patent No.: US 11,239,025 B2
(45) Date of Patent: Feb. 1, 2022

(54) INDUCTIVE DEVICE HAVING ELECTROMAGNETIC RADIATION SHIELDING MECHANISM AND MANUFACTURING METHOD OF THE SAME

(71) Applicant: REALTEK SEMICONDUCTOR CORPORATION, Hsinchu (TW)

(72) Inventor: Hsiao-Tsung Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 9 days.

(21) Appl. No.: 16/743,372

(22) Filed: Jan. 15, 2020

(65) Prior Publication Data

US 2020/0152378 A1 May 14, 2020

Related U.S. Application Data

(63) Continuation-in-part of application No. 15/291,748, filed on Oct. 12, 2016, now Pat. No. 10,825,597.

(30) Foreign Application Priority Data

Oct. 23, 2015 (TW) .................. 104134799

(51) Int. Cl.
| | |
|---|---|
| *H01F 27/36* | (2006.01) |
| *H01F 27/28* | (2006.01) |
| *H01F 27/34* | (2006.01) |
| *H01F 41/02* | (2006.01) |

(52) U.S. Cl.
CPC ......... *H01F 27/36* (2013.01); *H01F 27/2804* (2013.01); *H01F 27/346* (2013.01); *H01F 41/02* (2013.01); *H01F 2027/2809* (2013.01)

(58) Field of Classification Search
CPC ..... H01F 27/36; H01F 27/346; H01F 27/2804
See application file for complete search history.

(56) References Cited

U.S. PATENT DOCUMENTS

| | | | | |
|---|---|---|---|---|
| 5,173,671 | A * | 12/1992 | Wendler | H03H 7/0123 333/185 |
| 7,382,219 | B1 * | 6/2008 | Lee | H01F 17/0006 336/84 C |
| 8,062,930 | B1 * | 11/2011 | Shah | C25D 5/12 438/110 |
| 2002/0158306 | A1 * | 10/2002 | Niitsu | H01L 28/10 257/531 |
| 2004/0222511 | A1 * | 11/2004 | Zhang | H01L 23/552 257/686 |
| 2011/0006872 | A1 * | 1/2011 | Nazarian | H01F 17/0006 336/84 C |

(Continued)

*Primary Examiner* — Elvin G Enad
*Assistant Examiner* — Malcolm Barnes
(74) *Attorney, Agent, or Firm* — WPAT, PC

(57) ABSTRACT

The present disclosure discloses an inductive device having electromagnetic radiation shielding mechanism. The inductive device includes an inductive unit and a shielding structure. The shielding structure forms at least one closed shape that encloses the inductive unit. The shielding structure has a width thereof and a distance separated from the inductive unit such that a decreasing amount of a quality factor of the inductive unit is not larger than a first predetermined value and a shielded amount of electromagnetic radiation is not lower than a second predetermined value.

11 Claims, 21 Drawing Sheets

(56) References Cited

U.S. PATENT DOCUMENTS

| | | | | |
|---|---|---|---|---|
| 2011/0273261 | A1* | 11/2011 | Signoff | H01F 27/36 |
| | | | | 336/84 C |
| 2014/0091758 | A1* | 4/2014 | Hidaka | H04B 5/0037 |
| | | | | 320/108 |
| 2014/0210065 | A1* | 7/2014 | Nishimura | H01L 23/5222 |
| | | | | 257/676 |
| 2015/0348700 | A1* | 12/2015 | Hong | H01F 17/0006 |
| | | | | 336/84 C |
| 2016/0149543 | A1* | 5/2016 | Anderson | H02M 3/1563 |
| | | | | 330/295 |
| 2016/0365189 | A1* | 12/2016 | Jin | H04B 15/02 |
| 2018/0138746 | A1* | 5/2018 | Jang | H01Q 1/24 |
| 2018/0151287 | A1* | 5/2018 | Yosui | H01F 41/0233 |

* cited by examiner

INDUCTIVE DEVICE HAVING ELECTROMAGNETIC RADIATION SHIELDING MECHANISM AND MANUFACTURING METHOD OF THE SAME

BACKGROUND OF THE INVENTION

1. Field of the Invention

The present disclosure relates to an inductive device having electromagnetic radiation shielding mechanism and an inductive device manufacturing method.

2. Description of Related Art

Inductors and transformers are important elements in radio frequency integrated circuits to implement single-ended to differential signal conversion, signal coupling and impedance matching. As System-on-chips (SoC) become the mainstream of integrated circuits, integrated inductors and integrated transformers gradually substitute conventional discrete elements and are commonly applied to radio frequency integrated circuits. However, inductors and transformers in integrated circuits often either suffer from external electromagnetic radiation or affect other circuit components due to the generation of internal electromagnetic radiation thereof.

Therefore, it becomes an important issue to provide a electromagnetic radiation shielding mechanism to inductors and transformers in integrated circuits to avoid the interference of the electromagnetic radiation.

SUMMARY OF THE INVENTION

In consideration of the problem of the prior art, an object of the present disclosure is to provide a method of the same to provide.

The present disclosure discloses an inductive device having electromagnetic radiation shielding mechanism. The inductive device includes an inductive unit and a shielding structure. The shielding structure forms at least one closed shape that encloses the inductive unit. The shielding structure has a width thereof and a distance separated from the inductive unit such that a decreasing amount of a quality factor of the inductive unit is not larger than a first predetermined value and a shielded amount of electromagnetic radiation is not lower than a second predetermined value.

The present disclosure also discloses an inductive device manufacturing method that includes the steps outlined below. An inductive unit is formed in an integrated circuit. An electromagnetic radiation test is performed on the inductive unit. When an amount of electromagnetic radiation related to the inductive unit exceeds a radiation threshold value, a shielding structure forming at least one closed shape that encloses the inductive unit is formed. The shielding structure has a width thereof and a distance separated from the inductive unit such that a decreasing amount of a quality factor of the inductive unit is not larger than a first predetermined value and a shielded amount of electromagnetic radiation is not lower than a second predetermined value.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide

Figure 1A:
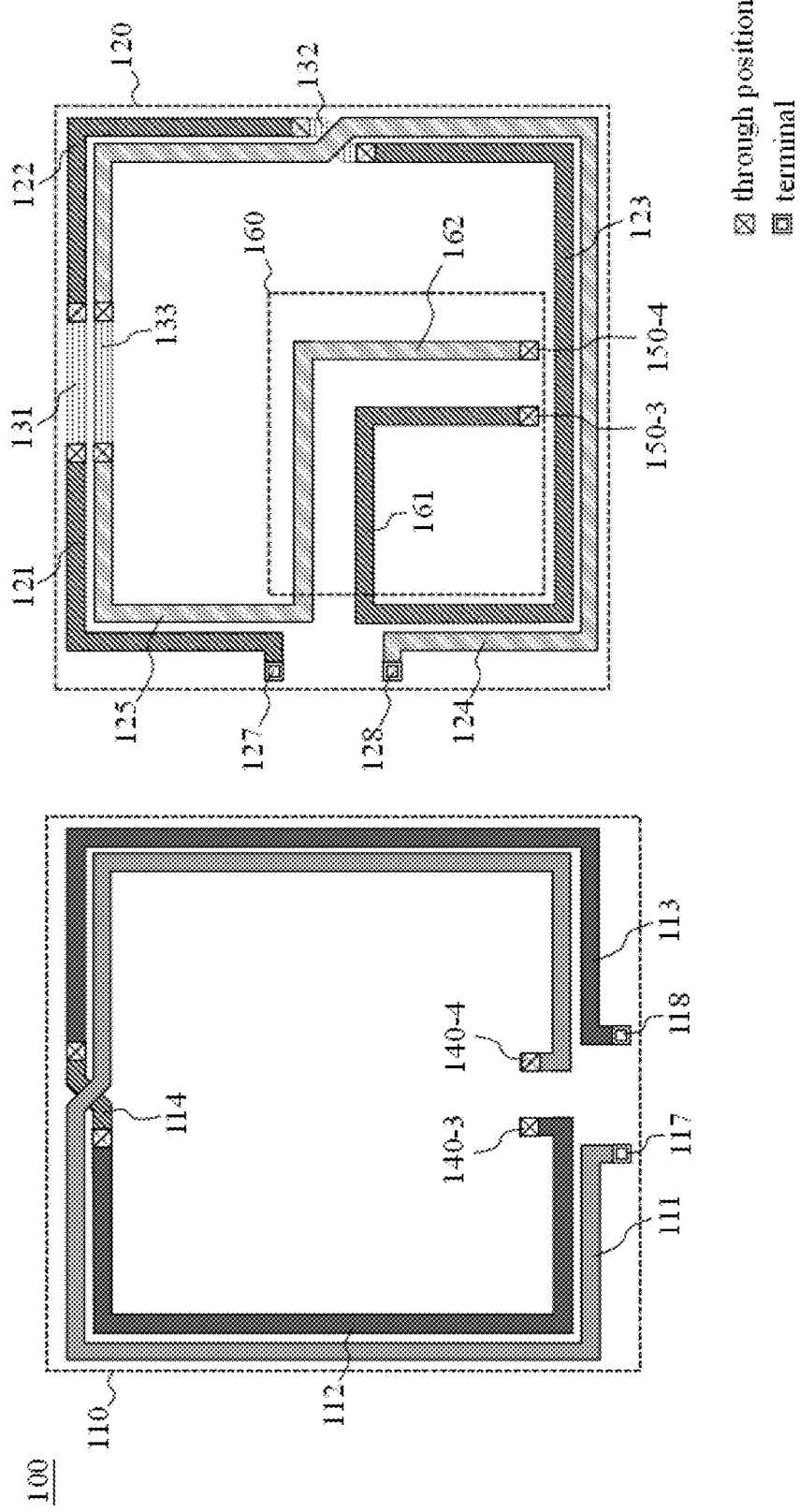
FIG. 1A illustrates a structure of a helical stacked integrated transformer according to an embodiment of the present invention.

FIG. 1A illustrates a structure of a helical stacked integrated transformer according to an embodiment of the present invention. The helical stacked integrated transformer 100 includes a helical coil 110 and a helical coil 120. The opening of the helical coil 110 and the opening of the helical coil 120 are perpendicular to each other. Most metal segments of the helical coil 110 are located in the first metal layer of the semiconductor structure. Most metal segments of the helical coil 120 are located in the second metal layer of the semiconductor structure. The helical coil 110 includes a terminal 117 and a terminal 118, and further includes a metal segment 111, a metal segment 112, a metal segment 113 and a metal segment 114. The left half of the metal segment 111 and the metal segment 113 together form the outer coil of the helical coil 110, and the right half of the metal segment 111 and the metal segment 112 together form the inner coil of the helical coil 110. The helical coil 120 includes a terminal 127 and a terminal 128, and further includes a metal segment 121, a metal segment 122, a metal segment 123, a metal segment 124, a metal segment 125, a metal segment 131, a metal segment 132 and a metal segment 133. The helical coil 120 includes an outer coil and an inner coil as well. The outer coil of the helical coil 120 includes the metal segment 121, the metal segment 131, the metal segment 122 and the lower part of the metal segment 124. The inner coil of the helical coil 120 includes the metal segment 125, the metal segment 133, an upper part of the metal segment 124 and the metal segment 123.

In the semiconductor structure, the metal segment 111, the metal segment 112 and the metal segment 113 are located in the first metal layer. The metal segment 114, the metal segment 121, the metal segment 122, the metal segment 123, the metal segment 124 and the metal segment 125 are located in the second metal layer. The metal segment 131, the metal segment 132 and the metal segment 133 are located in a third metal layer. The three metal layers are substantially parallel to one another. The metal segment 114 connects the metal segment 112 and the metal segment 113 via the through structures (located in the through positions in the figures) perpendicular to the metal layers. Therefore, the metal segment 114 can be deemed a part of the helical coil 110. Similarly, although the metal segment 131, the metal segment 132 and the metal segment 133 are located in the third metal layer, they respectively connect the metal segment 121 with the metal segment 122, the metal segment 122 with the metal segment 123, and the metal segment 124 with the metal segment 125 via multiple through structures. Therefore, the metal segment 131, the metal segment 132 and the metal segment 133 can be deemed as a part of the helical coil 120. The helical coil 110 and the helical coil 120 are a stacked structure, with the outer coils of both substantially overlapped and the inner coils of both substantially overlapped. That is, the helical coil 110 and the helical coil 120 do not contact each other except for the through positions, but share an overlapped region in the semiconductor structure.

The helical stacked integrated transformer 100 further includes a connecting structure 160. The connecting structure 160 is located within the overlapped region of the helical coil 110 and the helical coil 120. The connecting structure 160 includes a metal segment 161 and a metal segment 162. Note that in this embodiment, although the metal segment 161 is connected with the metal segment 123 and the metal segment 162 is connected with the metal segment 125, this invention specifically defines the metal segment 161 and the metal segment 162 as the connecting structure 160 to be distinguished from the inner coil. As such, the inner coil of the helical coil is explicitly defined to facilitate the description of this invention. The connecting structure 160 is mainly for connecting the inner coil of the helical coil 110 and the inner coil of the helical coil 120, and is thus located within the overlapped range of the helical coil 110 and the helical coil 120. In this embodiment, since the connecting structure 160 is located in the second metal layer, the metal segment 161 is directly connected with the metal segment 123, the metal segment 162 is directly connected with the metal segment 125, and the metal segment 161 and the metal segment 162 are respectively connected with the metal segment 112 and the metal segment 111 in the first metal layer via the through structures at the through position 150-3 and the through position 150-4 (the through position 150-3 corresponds to the through position 140-3 and the through position 150-4 corresponds to the through position 140-4). So, actually the metal segment 112 and the metal segment 161 are connected and the metal segment 111 and the metal segment 162 are connected. In another embodiment, the connecting structure 160 can be implemented in a different metal layer and be connected with metal segments in different layers via the through structures.

By analyzing the structure of the helical stacked integrated transformer 100, the helical stacked integrated transformer 100 in fact includes two inductors. The first inductor utilizes the terminal 117 as one of its terminals and the terminal 128 as the other. The first inductor mainly includes the metal segment 111, the metal segment 125, the metal segment 133 and the metal segment 124. In short, the first inductor includes the left half of the outer coil and the right half of the inner coil of the helical coil 110, and the upper half of the inner coil and the lower half of the outer coil of the helical coil 120 (i.e., the metal segments in light grey in FIG. 1A). Similarly, the second inductor utilizes the terminal 118 as one of its terminals and the terminal 127 as the other. The second inductor mainly includes the metal segment 113, the metal segment 114, the metal segment 112, the metal segment 123, the metal segment 132, the metal segment 122, the metal segment 131 and the metal segment 121. In short, the second inductor includes the right half of the outer coil and the left half of the inner coil of the helical coil 110, and the lower half of the inner coil and the upper half of the outer coil of the helical coil 120 (i.e., the metal segments in dark grey in FIG. 1A). The helical stacked integrated transformer 100 realizes the functions of a transformer through the coupling of the two inductors.

Figure 1B:
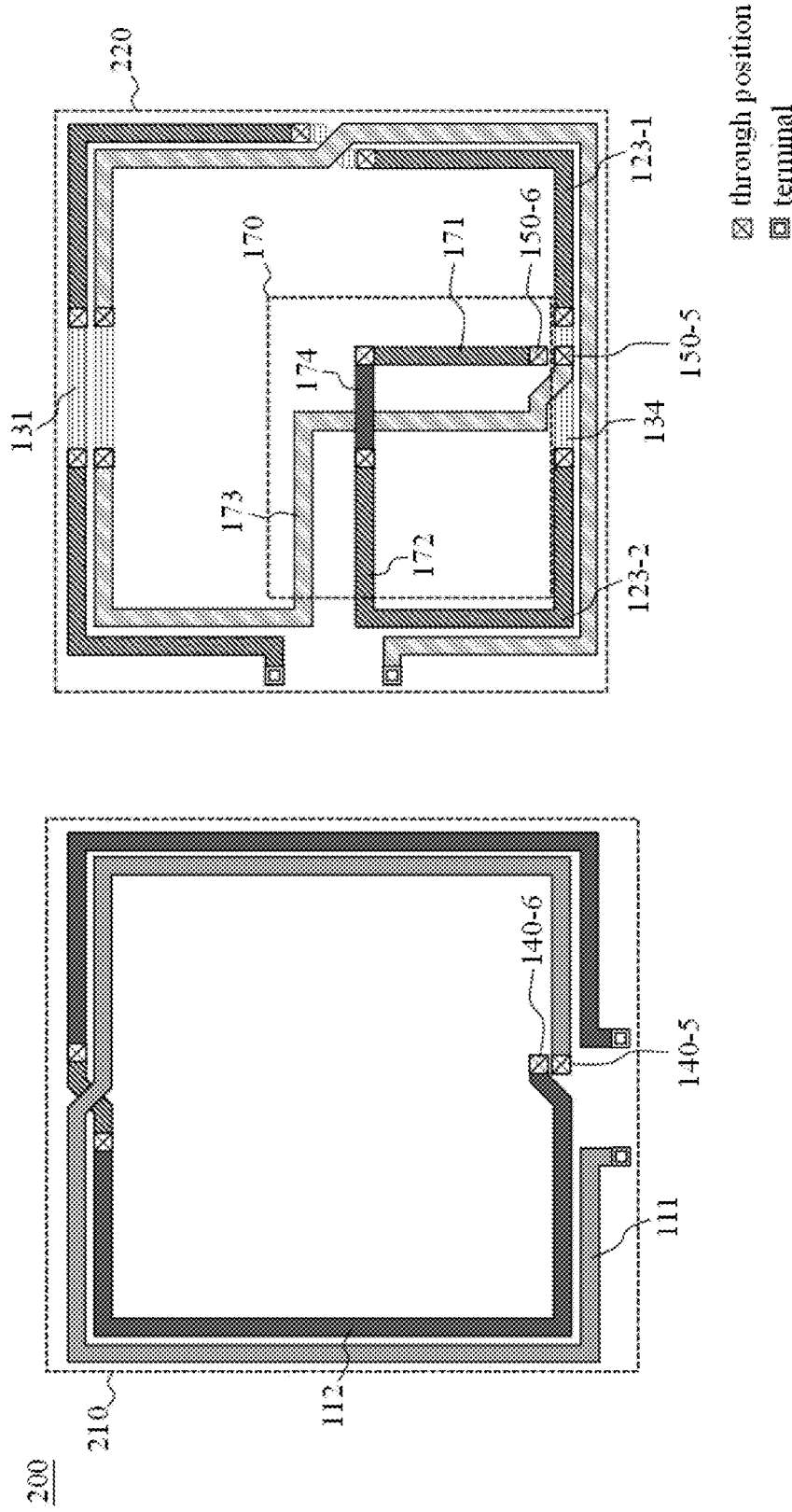
FIG. 1B illustrates a structure of the helical stacked integrated transformer according to another embodiment of this invention.

FIG. 1B illustrates a structure of the helical stacked integrated transformer according to another embodiment of this invention. Basically, the helical stacked integrated transformer 200 is similar to the helical stacked integrated transformer 100 in including 2 helical coils (i.e., the helical coil 210 and the helical coil 220), except that the metal segment 123 of the helical coil 120 is broken down into three metal segments in the helical coil 220, i.e., the metal segment 123-1 (the second metal layer), the metal segment 123-2 (the second metal layer) and the metal segment 134 (the third metal layer). In addition, the connecting structure 170 of the helical stacked integrated transformer 200 is slightly different from the connecting structure 160. The connecting structure 170 includes a metal segment 171, a metal segment 172, a metal segment 173 and a metal segment 174. The metal segment 174 is located in the first metal layer whereas other metal segments are located in the second metal layer. In other words, the connecting structure 170 in this embodiment is located in more than one metal layer. The through position 140-5 corresponds to the through position 150-5 and the through position 140-6 corresponds to the through position 150-6, such that the metal segment 112 is connected with the metal segment 171 via the through structure and the metal segment 111 is connected with the metal segment 173 via the through structure. Although the connecting structures of the helical stacked integrated transformer 100 and the helical stacked integrated transformer 200 are different, the configurations of the first inductor and the second inductor in the helical stacked integrated transformer 100 and the helical stacked integrated transformer 200 are substantially identical.

Figure 1C:
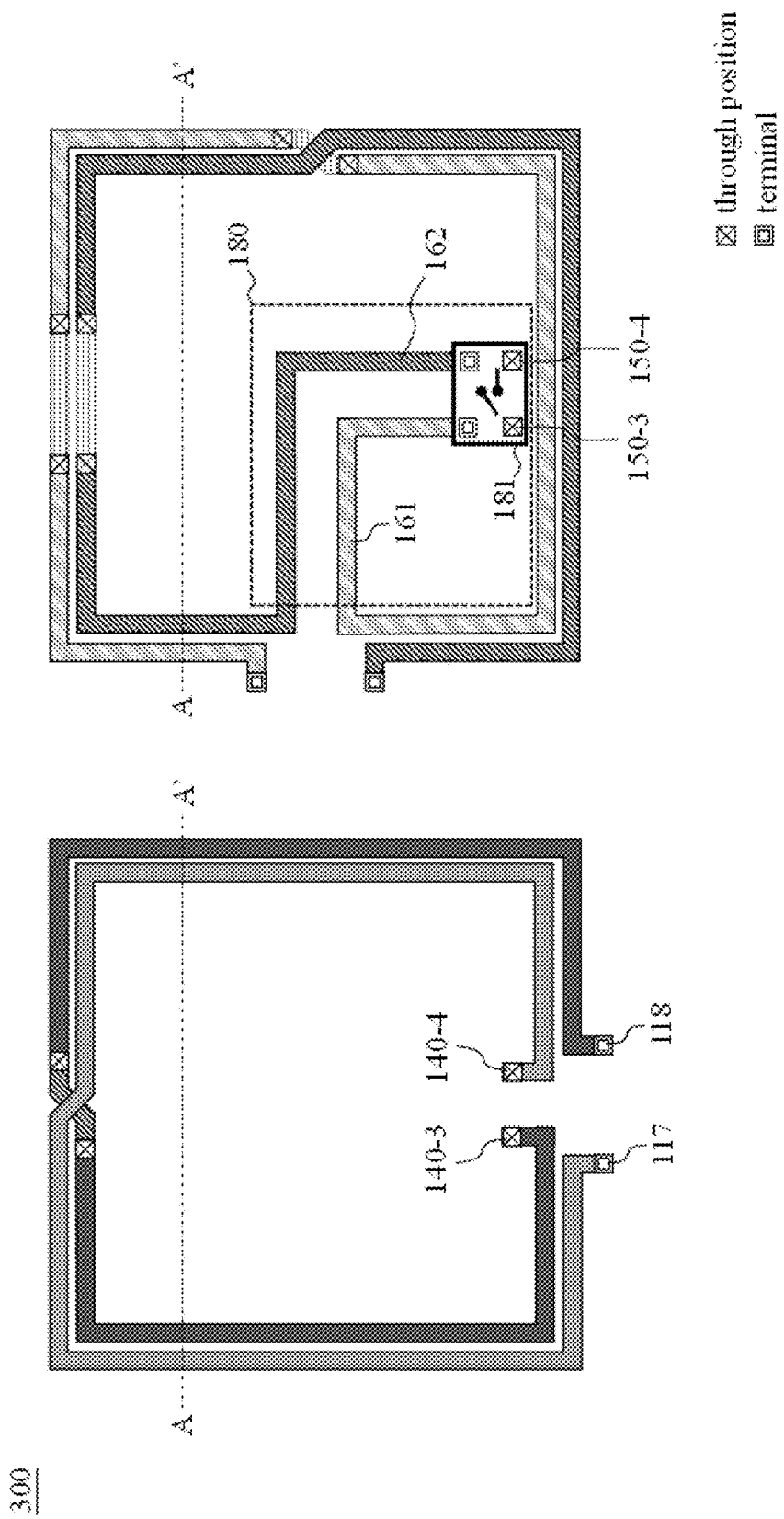
FIG. 1C illustrates a structure of the helical stacked integrated transformer according to another embodiment of this invention.
Figure 1D:
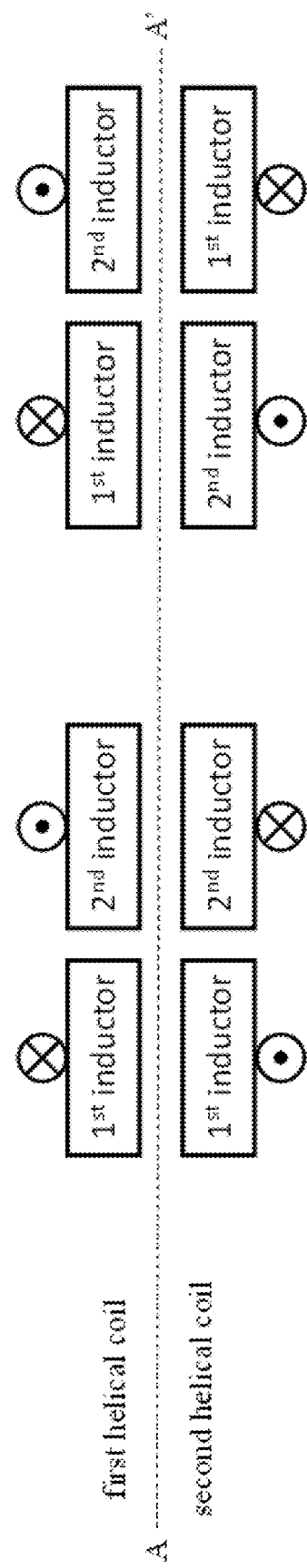
FIGS. 1D and 1E depict cross-sectional views of the helical stacked integrated transformer corresponding to different switching states of the switch module in FIG. 1C.
Figure 1E:
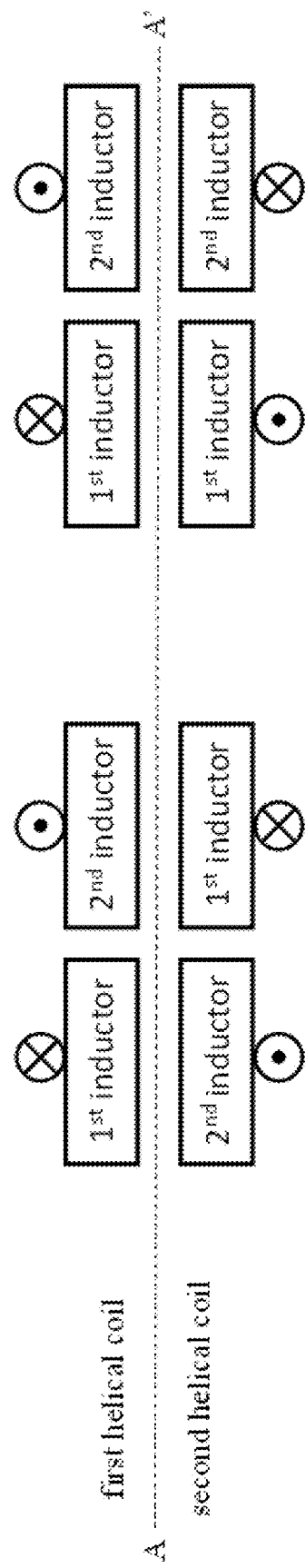

FIG. 1C illustrates a structure of the helical stacked integrated transformer according to another embodiment of this invention. In this embodiment, in addition to the metal segment 161 and the metal segment 162, the connecting structure 180 of the helical stacked integrated transformer 300 further includes the switch module 181. The switch module 181 decides how the through position 150-3 and the through position 150-4 are connected with the terminals of the metal segment 161 and the metal segment 162 by controlling the multiple switching units provided therein. For example, in a first switching state, the through position 150-3 and the through position 150-4 are respectively connected with the terminals of the metal segment 162 and the metal segment 161; in a second switching state, the through position 150-3 and the through position 150-4 are respectively connected with the terminals of the metal segment 161 and the metal segment 162. In one exemplary embodiment, the switch module 181 includes 4 switching units to carry out the above switching mechanism. For example, the switching units can be implemented by Metal-Oxide-Semiconductor Field-Effect Transistors (MOSFET). FIG. 1D and FIG. 1E are cross-sectional views of the helical stacked integrated transformer corresponding to different switching states of the switch module in FIG. 1C. FIG. 1D and FIG. 1E are made with respect to the cross section A-A' in FIG. 1C. The current directions of the first inductor and second inductor in the inner coil and the outer coil are also shown in this figure (here, the currents are assumed to flow into the two inductors via the terminal 117 and the terminal 118, respectively). FIG. 1D corresponds to the aforementioned first switching state, and FIG. 1E corresponds to the aforementioned second switching state. It is shown that, the switching of the switch module 181 causes the current directions in the two inductors to change, thus causing not only the self-inductance and the mutual inductance of the two inductors but also the inductance values of respective inductors to change. In other words, in practice, the inductance values of the two inductors of the helical stacked integrated transformer 300 can be adjusted through the switch module 181. It is also shown that, in this embodiment, the first metal layer in which the first helical coil is located is above the second metal layer in which the second helical coil is located. For example, the first and the second metal layers are the redistribution layer (RDL) and the Ultra-Thick Metal (UTM) layer of the semiconductor structure, respectively, and the third metal layer in which the metal segment 131, the metal segment 132 and the metal segment 133 are located is implemented in a metal layer under the UTM layer.

Figure 2B:
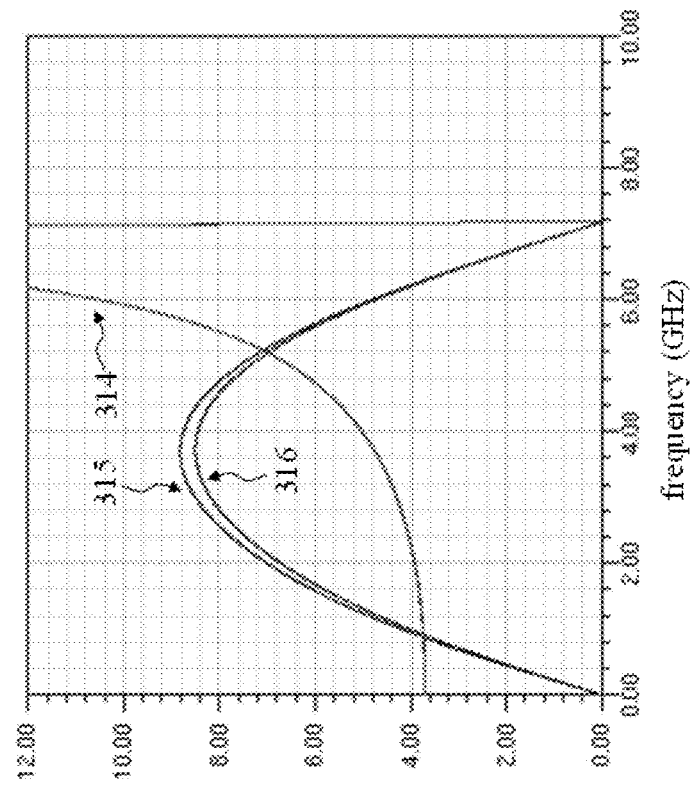
FIGS. 2A and 2B illustrate simulation results of the inductance value and the quality factor (Q) of the helical stacked integrated transformer 200 of FIG. 1B.
Figure 2A:
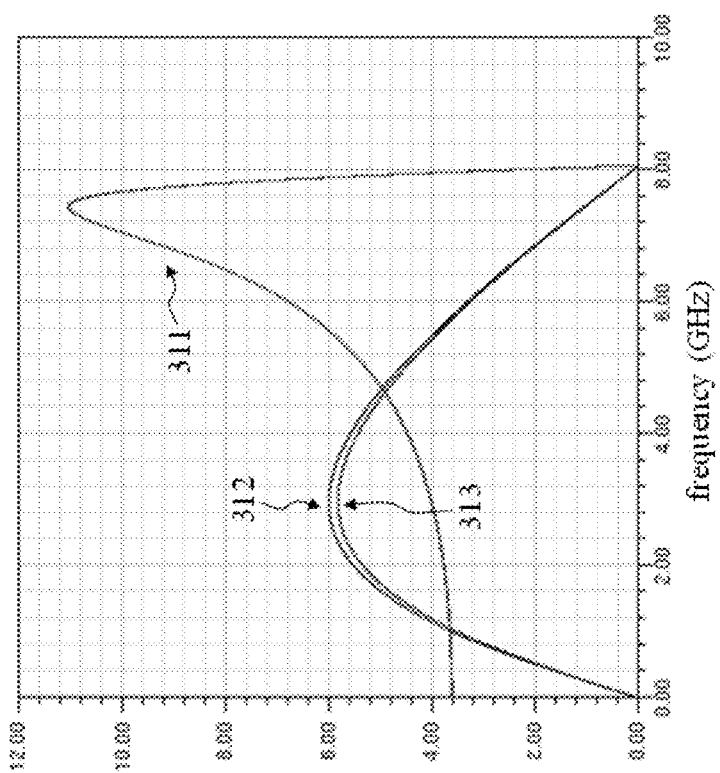

FIG. 2A and FIG. 2B show simulation results of the inductance value and the quality factor (Q) of the helical stacked integrated transformer 200 of FIG. 1B, where the linewidth is 4 μm, the number of turns is 4, the inner diameter is 38 μm and the line distance is 2 μm. The structure corresponding to FIG. 2A does not include a patterned ground shield, whereas the structure corresponding to FIG. 2B does. In FIG. 2A, the curve 311 stands for the inductance values (in nH) of the first inductor and the second inductor, with the inductance curves of the two inductors substantially overlapped. The curve 312 and the curve 313 respectively represent the quality factors (Q) of the first inductor and the second inductor. Similarly, in FIG. 2B, the curve 314 stands for the inductance values (in nH) of the first inductor and the second inductor, with the inductance curves of the two inductors substantially overlapped. The curve 315 and the curve 316 respectively represent the quality factors (Q) of the first inductor and the second inductor. As expected, the inductance value and the quality factor (Q) have better performances in the case where the patterned ground shield is present. In addition, it is further shown that, with the aforementioned transformer structure, the first inductor and the second inductor have substantially equal inductance values and almost identical quality factors (Q). In brief, although the first metal layer and the second metal layer in the semiconductor structure usually have different resistance values, and the inner coil and the outer coil of the helical coil may encounter different physical characteristics, the inductance values and quality factors (Q) of the first inductor and the second inductor are almost the same because the first inductor and the second inductor are evenly distributed in the first metal layer and the second metal layer and in the inner coil and the outer coil of the helical coil; therefore an excellent symmetry can be achieved.

Figure 3A:
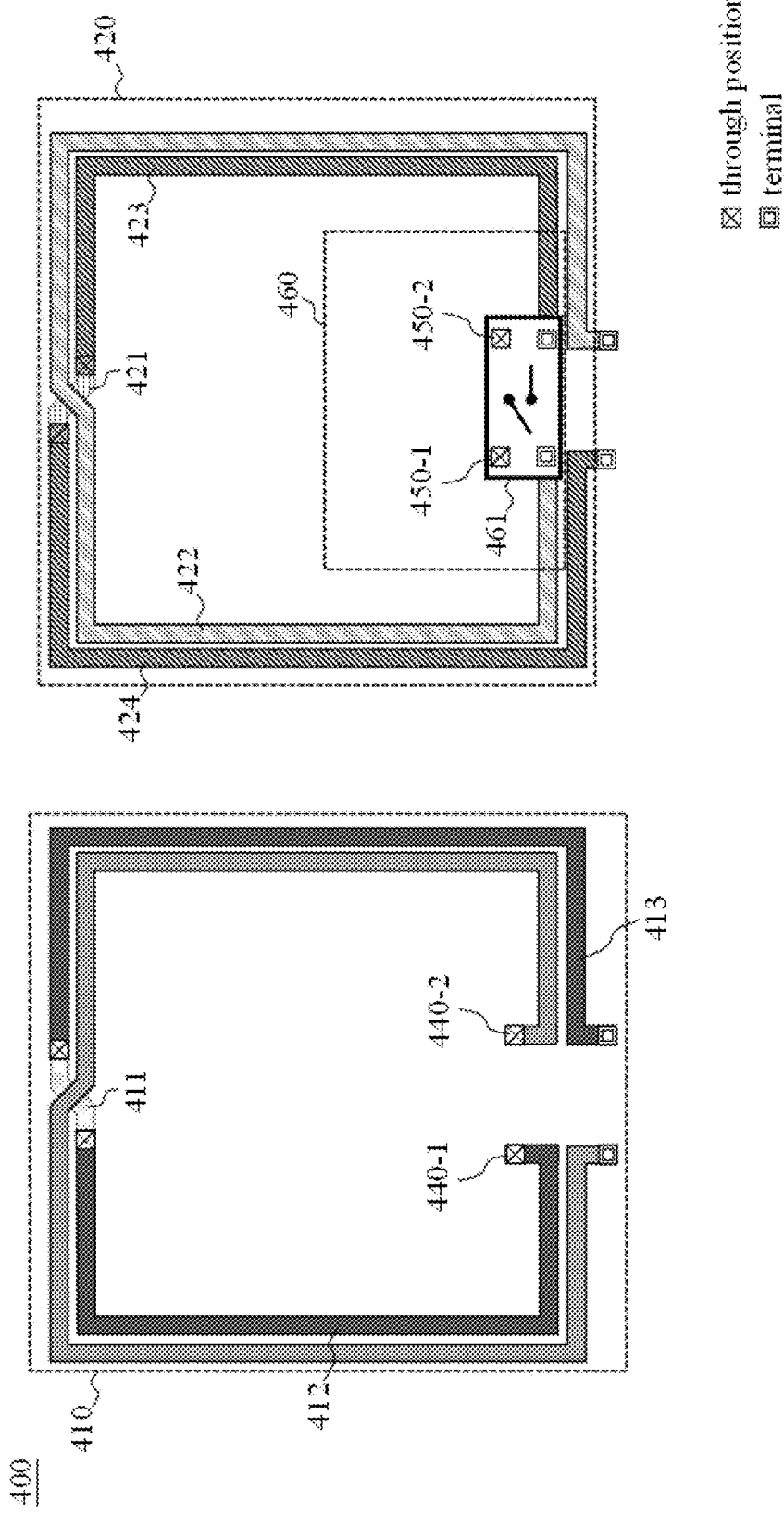
FIGS. 3A and 3B illustrate structures of the helical stacked integrated transformer according to another embodiment of this invention.
Figure 3B:
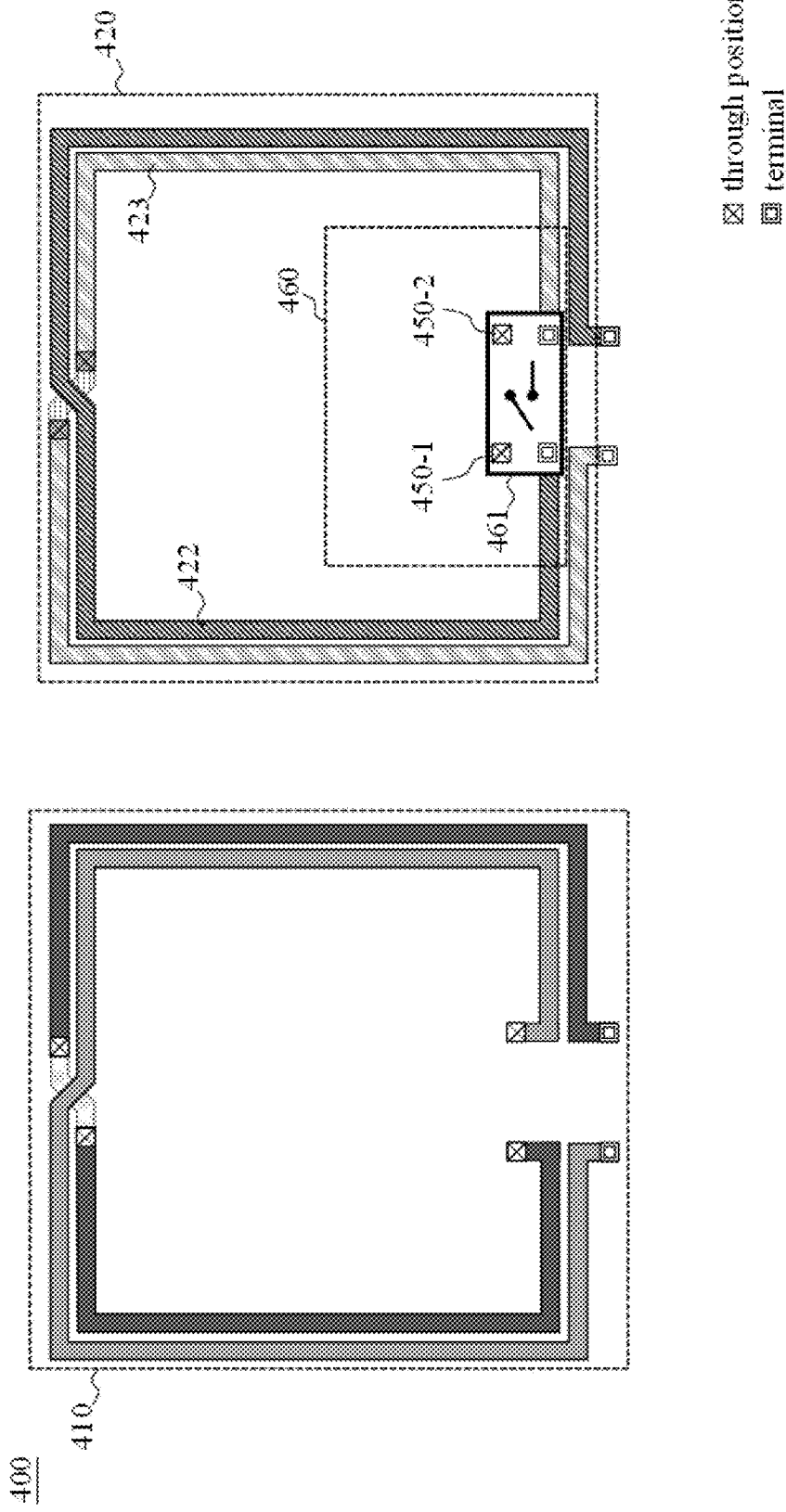

FIG. 3A and FIG. 3B illustrate structures of the helical stacked integrated transformer according to another embodiment of this invention. The helical stacked integrated transformer 400 includes the helical coil 410 and the helical coil 420, with the opening of the helical coil 410 and the opening of the helical coil 420 facing the same direction. The metal segment 411, which is implemented in a fourth metal layer, connects the metal segment 412 and the metal segment 413. The metal segment 421, which is implemented in the third metal layer, connects the metal segment 424 and the metal segment 423. The connecting structure 460 of this embodiment is located within the overlapped region of the helical coil 410 and the helical coil 420 as well, and includes a switch module 461. The switch module 461 connects one terminal of each of the metal segment 422 and the metal segment 423 with the through position 450-1 and the through position 450-2. The through position 450-1 and the through position 450-2 correspond respectively to the through position 440-1 and the through position 440-2. Similarly, the switch module 461 is able to determine the connections of the through position 450-1 and the through position 450-2 with the terminal of the metal segment 422 and the terminal of the metal segment 423 by altering the switching states of multiple switching units provided therein. In FIG. 3A, the terminal of the metal segment 422 is connected with the through position 450-2, and the terminal of the metal segment 423 is connected with the through position 450-1. As a result, the first inductor includes the left half of the outer coil and the right half of the inner coil of the helical coil 410 as well as the right half of the outer coil and the left half of the inner coil of the helical coil 420 (i.e., the metal segments in light grey); the second inductor includes the right half of the outer coil and the left half of the inner coil of the helical coil 410 as well as the left half of the outer coil and the right half of the inner coil of the helical coil 420 (i.e., the metal segments in dark grey).

FIG. 3B shows an alternative switching state of the helical stacked integrated transformer 400: the terminal of the metal segment 422 is connected with the through position 450-1 and the terminal of the metal segment 423 is connected with the through position 450-2. As a result, the first inductor includes the left half of the outer coil and the right half of the inner coil of the helical coil 410 as well as the left half of the outer coil and the right half of the inner coil of the helical coil 420 (i.e., the metal segments in light grey); the second inductor includes the right half of the outer coil and the left half of the inner coil of the helical coil 410 as well as the right half of the outer coil and the left half of the inner coil of the helical coil 420 (i.e., the metal segments in dark grey). When the configurations of the first inductor and the second inductor change, the current directions and the self-inductance and the mutual inductance of the two inductors also change; therefore, the inductance values of the two inductors can be adjusted accordingly.

Figure 4:
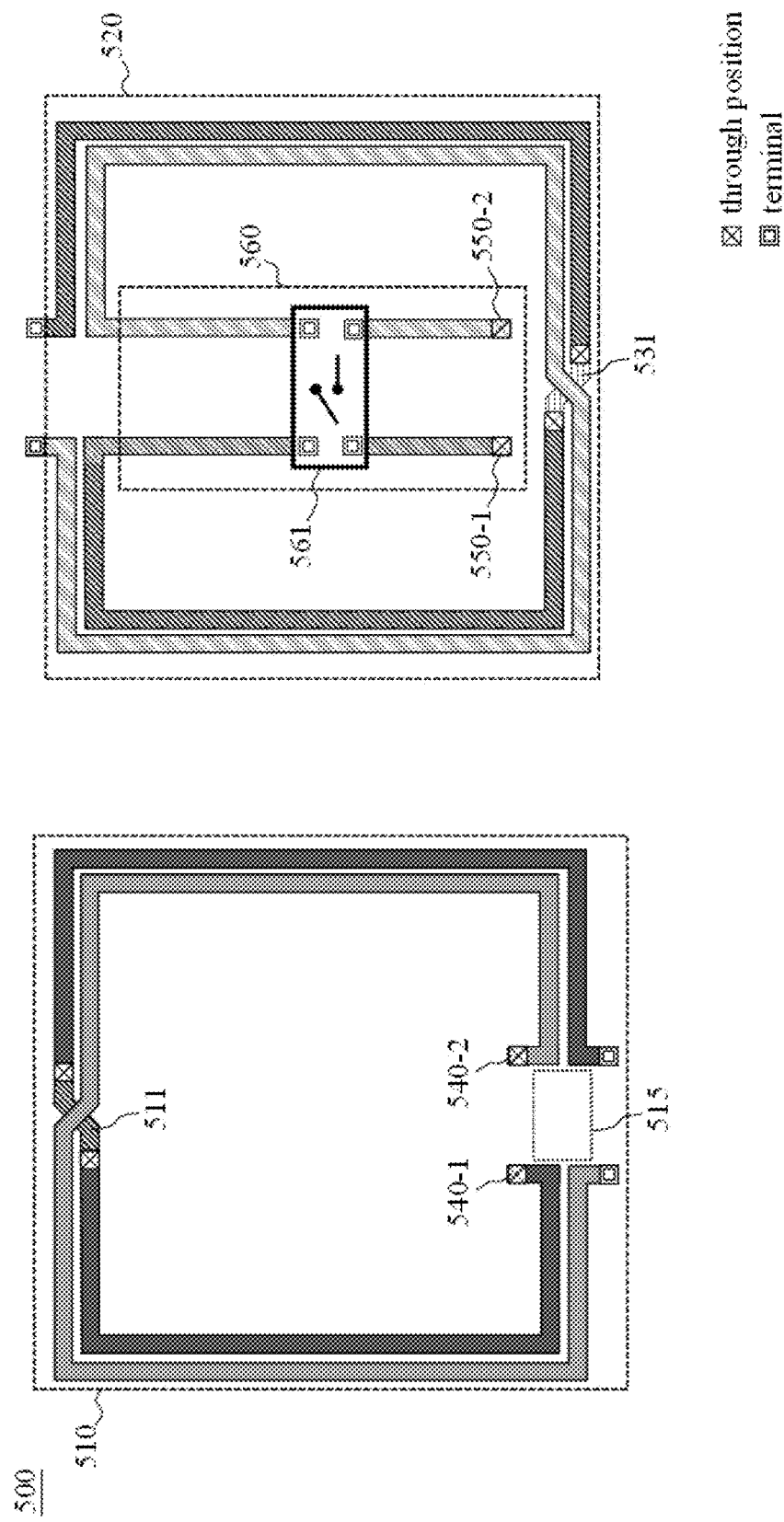
FIG. 4 illustrates a structure of the helical stacked integrated transformer according to another embodiment of this invention.

FIG. 4 illustrates a structure of the helical stacked integrated transformer according to another embodiment of this invention. The helical stacked integrated transformer 500 includes the helical coil 510 and the helical coil 520. The opening of the helical coil 510 and the opening of the helical coil 520 face opposite directions, i.e., the openings of the two helical coils differ by 180 degrees. Although being in the second metal layer, the metal segment 511 is a part of the helical coil 510. Thus, a large part of the helical coil 510 is implemented in the first metal layer while a small part is implemented in the second metal layer. Similarly, although being in the third metal layer, the metal segment 531 is a part of the helical coil 520. Thus, a large part of the helical coil 520 is implemented in the second metal layer while a small part is implemented in the third metal layer. The through position 540-1 and the through position 540-2 correspond to the through position 550-1 and the through position 550-2, respectively. The connecting structure 560 is located within the overlapped region of the helical coil 510 and the helical coil 520, and includes multiple metal segments and the switch module 561. The configurations of the first inductor and the second inductor are changed by altering the switching state of the switch module 561. In FIG. 4, the metal segments in light grey constitute the first inductor and those in dark grey constitute the second inductor. Note that although the metal segment 531 is implemented in the third metal layer in this embodiment, it can also be implemented in the first metal layer to reduce the number of metal layers used by the helical stacked integrated transformer 500 since there is no metal segment at a corresponding position in the first metal layer (as indicated by the region 515).

Figure 5:
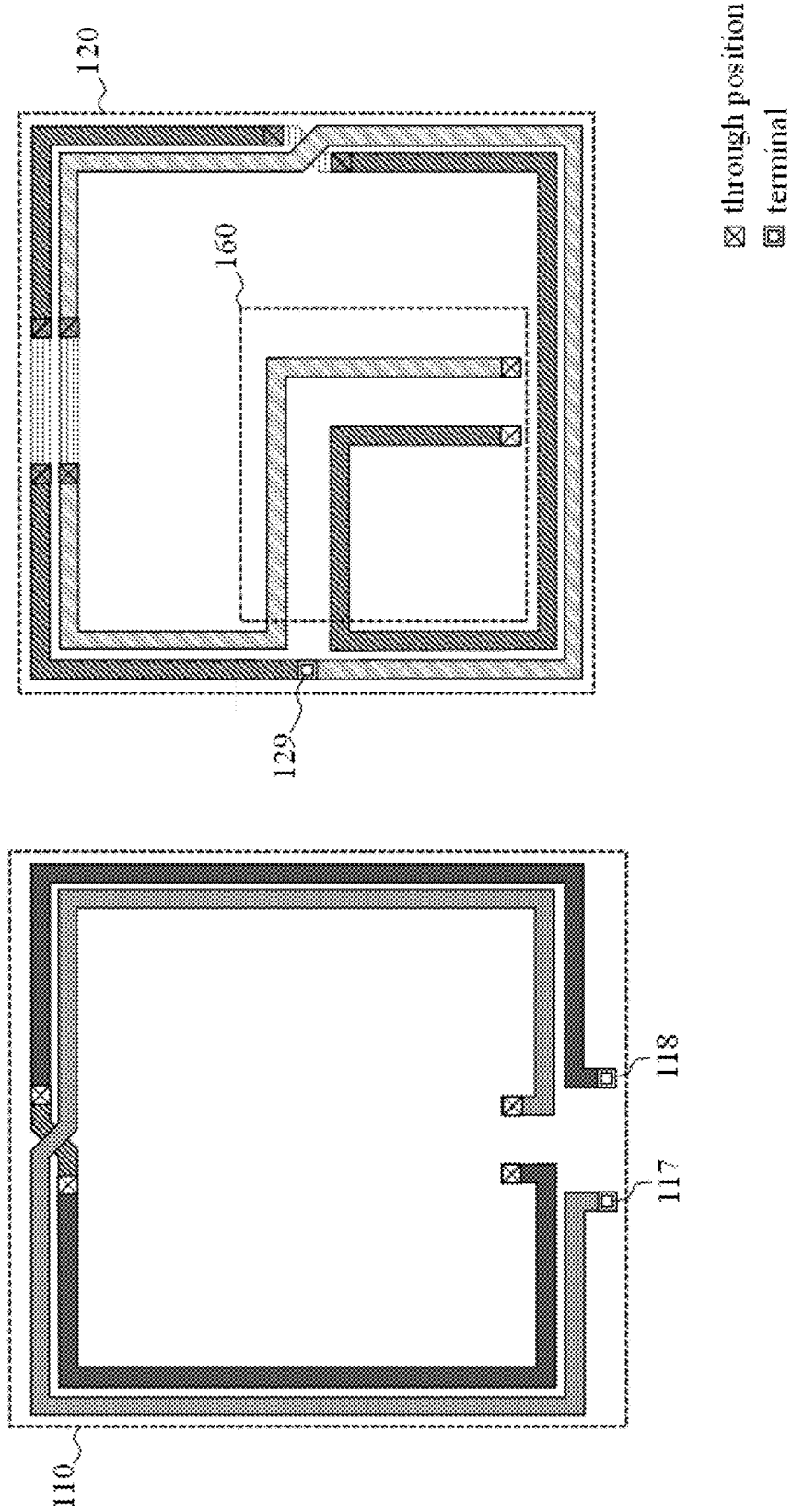
FIG. 5 illustrates a structure of the helical stacked integrated inductor according to an embodiment of this invention.

In addition to the helical stacked integrated transformer, this invention further discloses a helical stacked integrated inductor. From any helical stacked integrated transformer structure disclosed above, a helical stacked integrated inductor can be obtained if the two terminals of one of the helical coils are connected. Taking the helical stacked integrated transformer 100 of FIG. 1A as an example, after the terminal 127 and the terminal 128 of the helical coil 120 are connected, the structure in FIG. 5 can be obtained. The newly formed terminal 129 can be used as a center tap of the inductor. The center tap can be connected to a voltage source of a circuit where the helical stacked integrated inductor is incorporated or to the ground. More specifically, the integrated inductor includes two inductive units and uses the center tap as its center of symmetry. The first inductive unit that includes the metal segments in light grey employs the terminal 117 and the terminal 129 as its two terminals, and the second inductive unit that includes the metal segments in dark grey employs the terminal 118 and the terminal 129 as its two terminals According to the analysis on the helical stacked integrated transformer, the first inductive unit and the second inductive unit based on this structure have excellent symmetry, and are thus suitable for passive components in an integrated circuit. The above method can be applied to the helical stacked integrated transformer 200, the helical stacked integrated transformer 300, the helical stacked integrated transformer 400 and the helical stacked integrated transformer 500 to form a helical stacked integrated inductor.

Figure 6A:
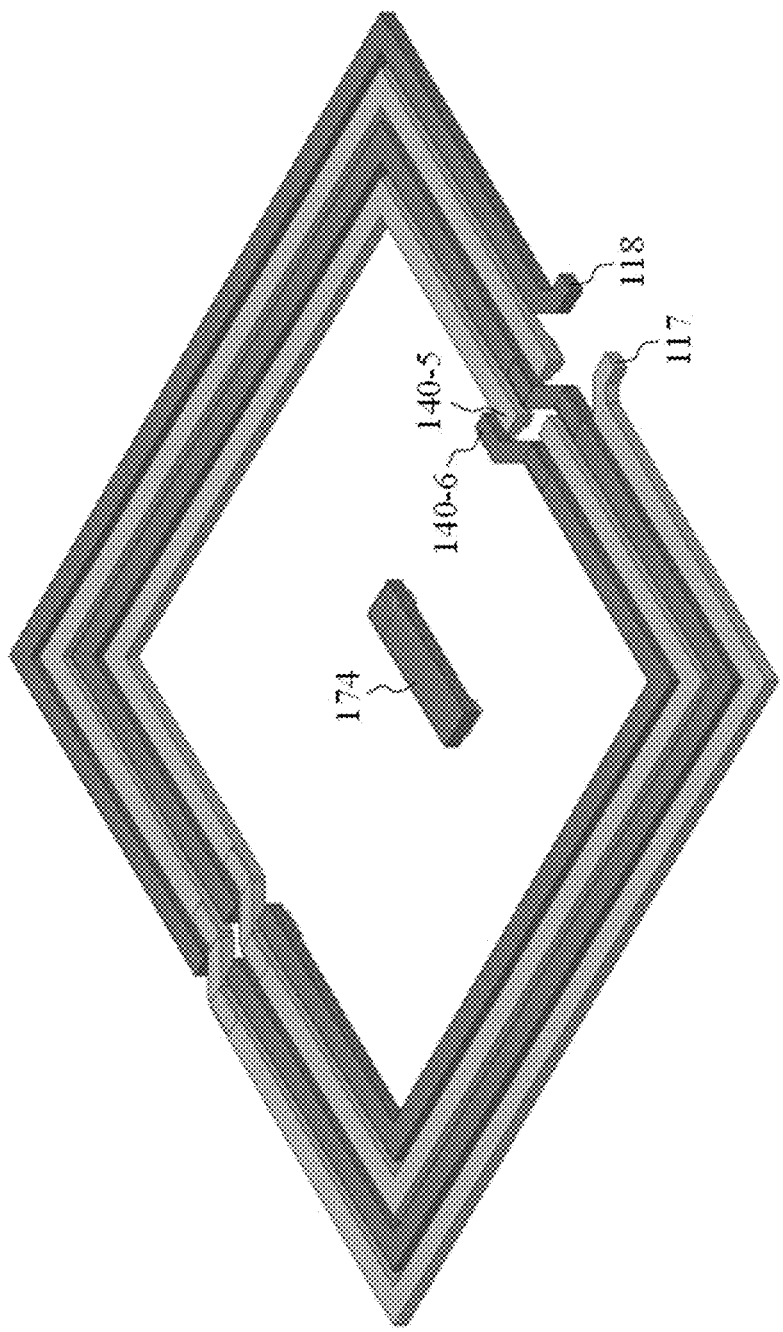
FIGS. 6A-6C illustrate a three-dimensional (3D) structure of the helical stacked integrated transformer according to another embodiment of this invention.
Figure 6B:
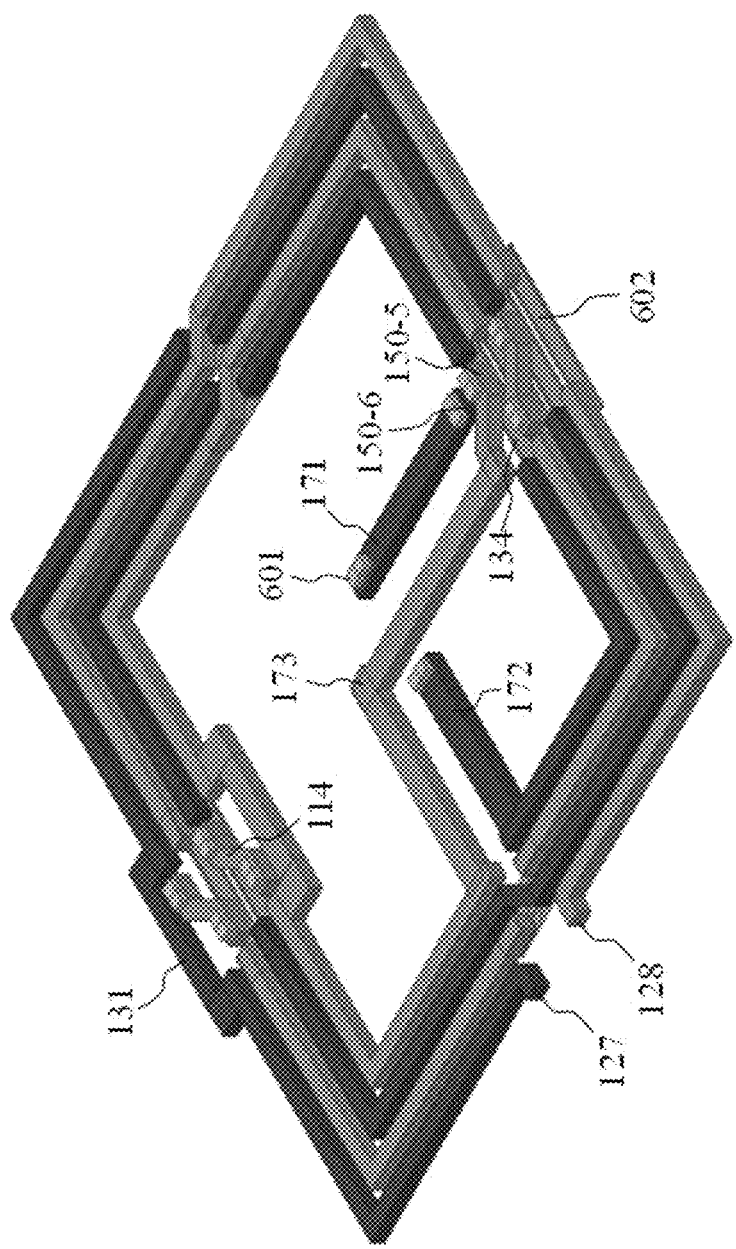
Figure 6C:
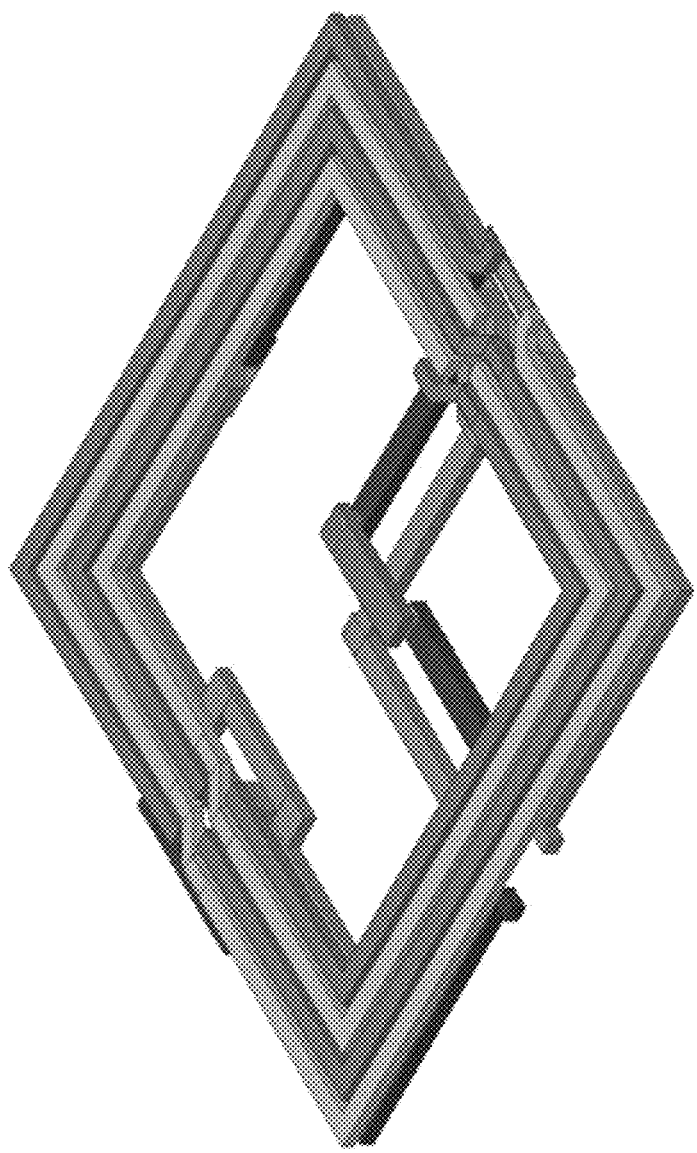

Note that the helical stacked integrated transformer or the helical stacked integrated inductor of this invention is not limited to the two-turn structures exemplified in the above embodiments. In practice, any helical coil can be implemented in more turns. FIGS. 6A-6C illustrate a three-dimensional (3D) structure of the helical stacked integrated transformer according to another embodiment of this invention. FIG. 6A depicts the metal segments implemented in the first metal layer; FIG. 6B depicts the metal segments implemented in the second metal layer and the third metal layer; FIG. 6C depicts the two metal layers, which are stacked. In this structure, the metal segments implemented in the third metal layer are illustrated by flat segments in FIG. 6B, such as the metal segment 134. A cross reference to this structure and the helical stacked integrated transformer 200 shown in FIG. 1B facilitates the understanding of this invention, despite the fact that the two helical coils are both implemented in four turns. Corresponding elements have identical denotations. The metal segment 131 in FIG. 1B is implemented in the second metal layer in FIG. 6B. The through structure 601 connects the metal segments at its corresponding through positions and can be implemented by a via structure or a via array. If a silicon layer is sandwiched by the two metal layers connected by the through structure 601, the through structure 601 would be a through silicon via (TSV). If the through structures are removed, the metal segments in the first metal layer and the metal segments in the second metal layer are not connected. The helical stacked integrated transformer and helical stacked integrated inductor of this invention are not limited to a rectangular structure but may be implemented as other polygons. Although the metal segment 602 is implemented in the third metal layer in FIG. 6B, it can be made in the second metal layer as well, as shown in FIGS. 1A and 1B.

Figure 7:
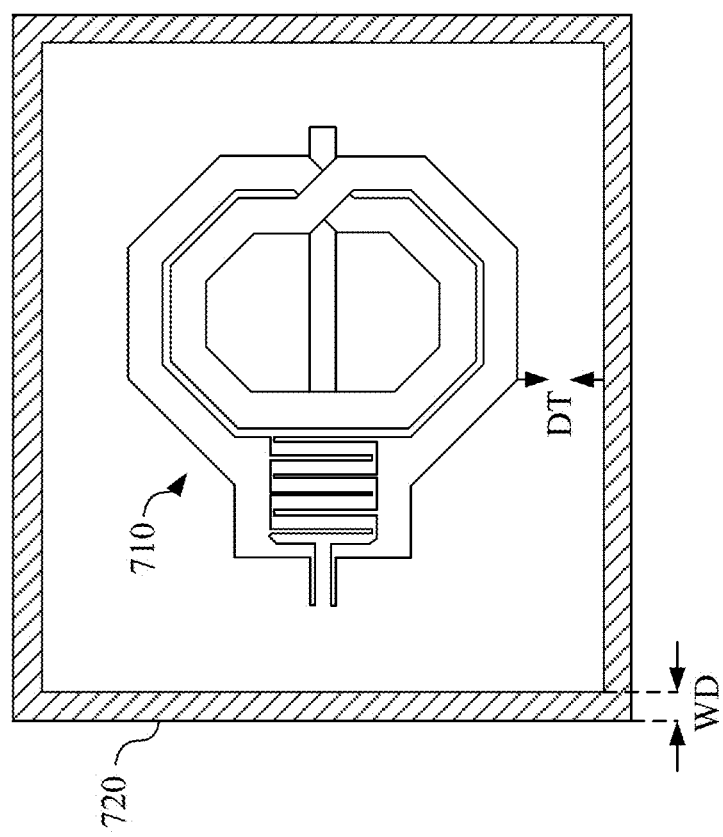
FIG. 7 illustrates a top view of an inductive device having electromagnetic radiation shielding mechanism according to an embodiment of this invention.

FIG. 7 illustrates a top view of an inductive device 700 having electromagnetic radiation shielding mechanism according to an embodiment of this invention. The inductive device 700 includes an inductive unit 710 and a shielding structure 720.

The inductive unit 710 includes circuit components such as, but not limited to an integrated inductor or an integrated transformer. Further, in an embodiment, the inductive unit 710 can function as such as, but not limited to a voltage control oscillator (VCO) or a power amplifier. However, the present invention is not limited thereto.

The inductive unit 710 is able to generate internal electromagnetic radiation such that external circuit components (not illustrated) nearby may be affected by the electromagnetic radiation generated by the inductive unit 710. On the contrary, external electromagnetic radiation generated by the external circuit components nearby may also affect the operation of the inductive unit 710.

As illustrated in FIG. 7, the shielding structure 720 forms at least one closed shape that encloses the inductive unit 710. In an embodiment, a material of the shielding structure 720 is metal, and the closed shape is a ring-like shape that can be a circle, a rectangular or any other shape that includes an enclosed area therewithin to expose the inductive unit 710 underneath. Further, the shielding structure 720 is either electrically isolated or electrically coupled to a ground level.

When an electromagnetic radiation is generated nearby the shielding structure 720, either by the inductive unit 710 or by the external circuit components, an induced current is generated by the shielding structure 720 having the closed shape such that a magnetic field against the electromagnetic radiation is generated.

As a result, the shielding structure 720 either prevents the inductive unit 710 from being affected by the external electromagnetic radiation from the external circuit components nearby or prevents the internal electromagnetic radiation generated by the inductive unit 710 from leaking out to affect the external circuit components nearby.

In an embodiment, a width of the shielding structure 720 and a distance of the shielding structure 720 separated from the inductive unit 710 together determine the amount of the electromagnetic radiation that the shielding structure 720 is able to shield. However, the presence of the shielding structure 720 may also reduce the performance of the inductive unit 710.

As a result, in an embodiment, the shielding structure 720 has a width WD thereof and a distance DT separated from the inductive unit 710 such that a decreasing amount of a quality factor of the inductive unit 710 is not larger than a first predetermined value and a shielded amount of electromagnetic radiation is not lower than a second predetermined value.

In a numerical example, the width of the shielding structure 720 ranges from 3 micrometers to 8 micrometers and the distance ranges from 15 micrometers to 20 micrometers. The decreasing amount of the quality factor of the inductive unit 710 is not larger than 20% of the quality factor of the inductive unit 710 when the shielding structure 720 is not presented. The shielded amount of electromagnetic radiation is not lower than 3 dB. However, the present invention is not limited thereto.

In an integrated circuit, the inductive circuit components thereof may suffer from strong couples between each other. Especially, the inductive circuits such as a voltage control oscillator (VCO) or a power amplifier may generate strong electromagnetic radiation that affects operation of other circuits. In some approaches, a metal plate is used to cover the whole inductive circuit to prevent the inductive circuit from affecting other circuits by the electromagnetic radiation therefrom or from being affected by the electromagnetic radiation from other circuits. However, the metal plate directly impacts the quality factor and the inductance of the inductive circuit.

As a result, the inductive device of present invention uses a shielding structure forming the closed shape that encloses the inductive unit to reduce the electromagnetic radiation without making impact on the operation of the inductive unit.

In different embodiments, the shielding structure can be disposed in different positions relative to the inductive unit.

Figure 8A:
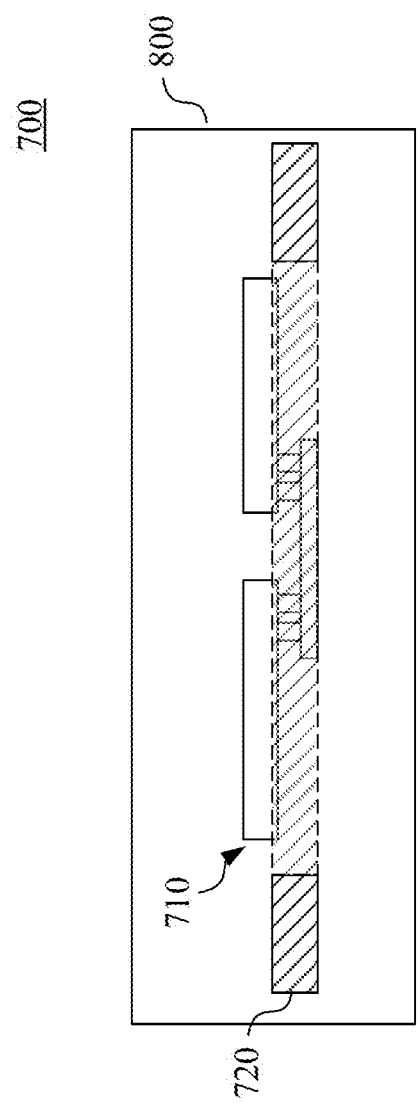
FIG. 8A, FIG. 8B and FIG. 8C depict cross-sectional views of the inductive device according to an embodiment of this invention.
Figure 8B:
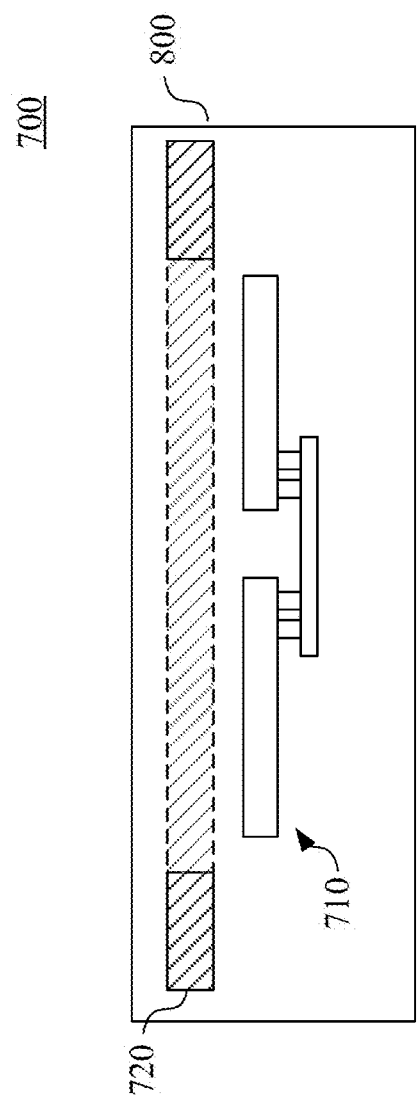
Figure 8C:
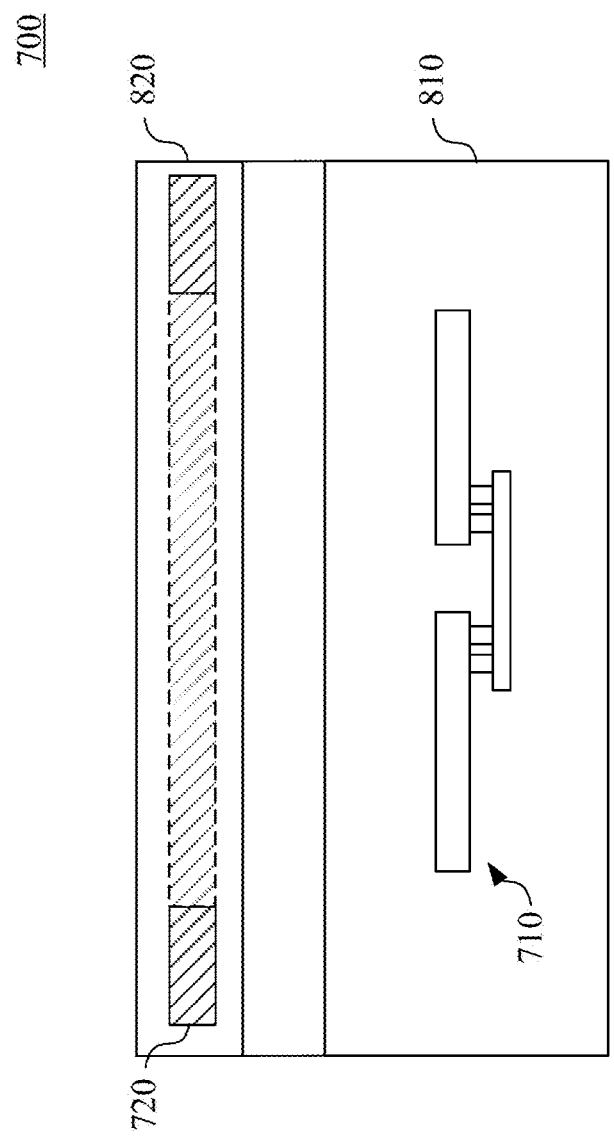

FIG. 8A, FIG. 8B and FIG. 8C depict cross-sectional views of the inductive device 700 according to an embodiment of this invention.

As illustrated in FIG. 8A and FIG. 8B, the inductive unit 710 is formed in a circuit layer 800 that includes a same level of metal connections. The shielding structure 720 is formed in the same circuit layer 800. Furthermore, the shielding structure 720 can either be formed in a same plane that the inductive unit 710 is disposed as illustrated in FIG. 8A or above the plane that the inductive unit 710 is disposed as illustrated in FIG. 8B.

As illustrated in FIG. 8C, the inductive unit 710 is formed in a circuit layer 810 that includes a same level of metal connections. The shielding structure 720 is formed in another circuit layer 820 that includes another level of metal connections.

In an embodiment, the electromagnetic radiation issue may become worse due to an asymmetric layout of the inductive device that generates phase mismatch.

Figure 9A:
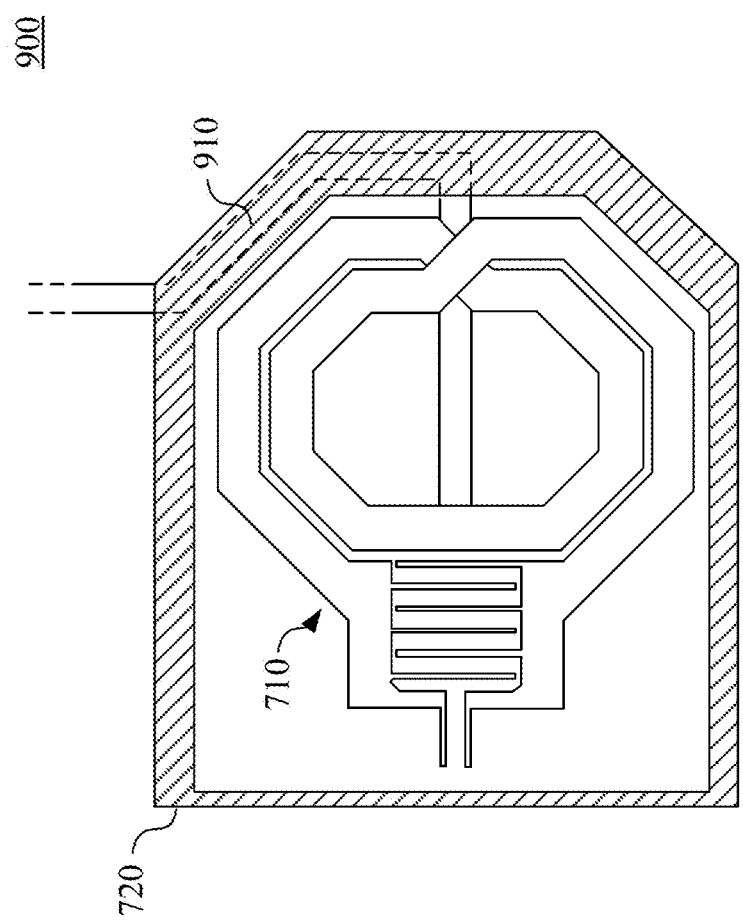
FIG. 9A illustrates a top view of an inductive device according to an embodiment of this invention.

FIG. 9A illustrates top views of an inductive device 900 according to an embodiment of this invention Similar to the inductive device 700 illustrated in FIG. 7, the inductive device 900 includes the inductive unit 710 and the shielding structure 720, in which the inductive unit 710 has a symmetric shape. However, in the present embodiment, the inductive device 900 further includes an asymmetric inductive portion 910.

As illustrated in FIG. 9A, the asymmetric inductive portion 910 is electrically coupled to the inductive unit 710 such that the inductive unit 710 is further electrically coupled to external electronic components through the asymmetric inductive portion 910. The closed shape of the shielding structure 720 is formed to enclose the inductive unit 710 and cover the asymmetric inductive portion 910.

Figure 9B:
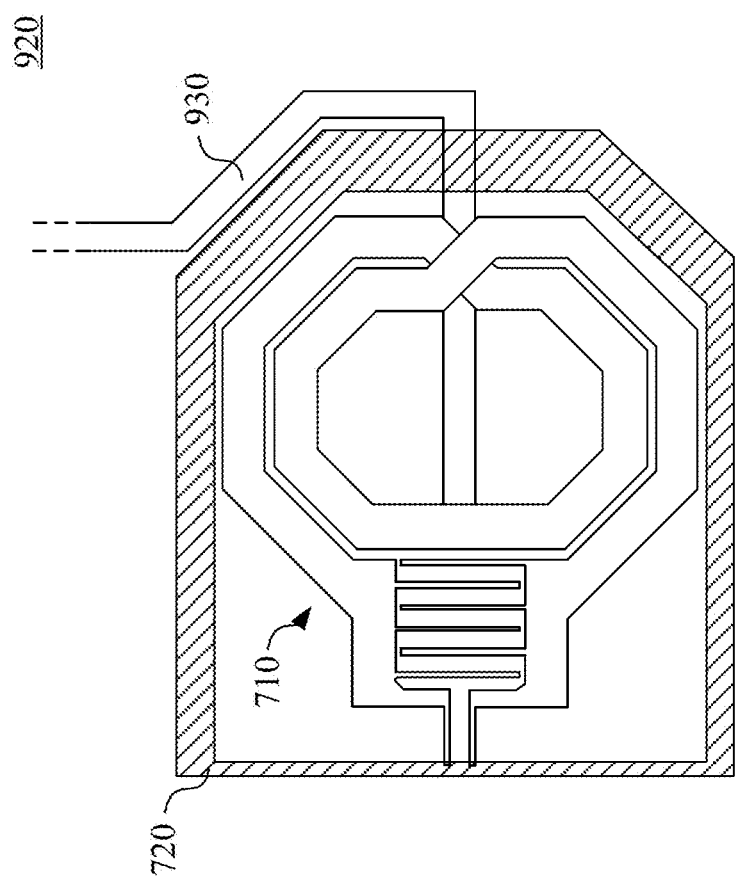
FIG. 9B illustrates a top view of an inductive device according to an embodiment of this invention.

FIG. 9B illustrates top views of an inductive device 920 according to an embodiment of this invention Similar to the inductive device 700 illustrated in FIG. 7, the inductive device 900 includes the inductive unit 710 and the shielding structure 720, in which the inductive unit 710 has a symmetric shape. However, in the present embodiment, the inductive device 920 further includes an asymmetric inductive portion 930.

As illustrated in FIG. 9B, the asymmetric inductive portion 930 is electrically coupled to the inductive unit 710 such that the inductive unit 710 is further electrically coupled to external electronic components through the asymmetric inductive portion 930. The closed shape of the shielding structure 720 is formed to enclose the inductive unit 710 and keep the asymmetric inductive portion 930 outside of the closed shape.

By either covering the asymmetric inductive portion by the shielding structure or keeping the asymmetric inductive portion outside of the closed shape formed by the shielding structure, the inductive device can reduce the impact of the phase mismatch generated due to the asymmetric inductive portion.

It is appreciated that the shape, the width and the distance of the shielding structure illustrated in FIG. 9A and FIG. 9B are merely an example. In other embodiments, the shape, the width and the distance of the shielding structure can be different based on practical requirements. Further, in an embodiment, due to the structure of the inductive unit, the shielding structure may have different shapes. For example, if the inductive unit is an 8-shaped inductor that includes two inductive loops electrically coupled together, the shielding structure may include at least two shielding units (not illustrated) forming two closed shapes each enclosing one of the inductive loops.

In an embodiment, the inductive unit may be implemented by various kind of inductors or transformers, e.g. helical stacked integrated transformer 100 that includes the helical coil 110 and the helical coil 120 illustrated in FIG. 1.

Figure 10:
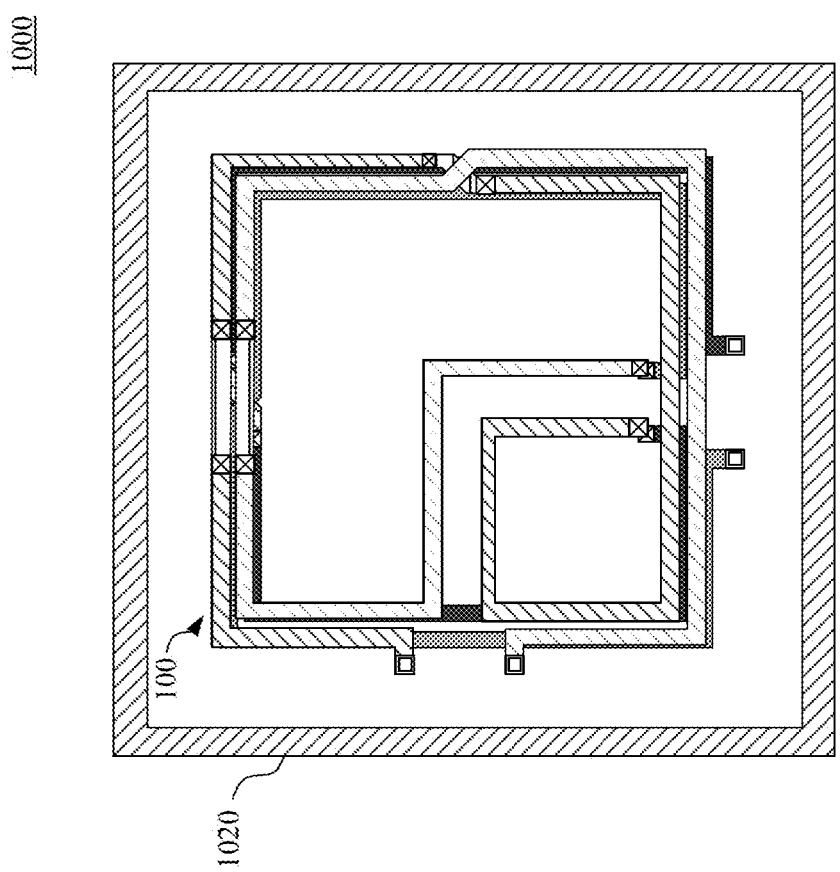
FIG. 10 illustrates a top view of an inductive device having electromagnetic radiation shielding mechanism according to an embodiment of this invention.

FIG. 10 illustrates a top view of an inductive device 1000 having electromagnetic radiation shielding mechanism according to an embodiment of this invention. The inductive device 1000 includes an inductive unit implemented by the helical stacked integrated transformer 100 and a shielding structure 1020, in which the helical coil 110 and the helical coil 120 included in the helical stacked integrated transformer 100 are not labeled in FIG. 10.

As a result, the inductive device of the present invention can be applied to the inductive unit implemented by using the helical stacked structure as well.

Figure 11:
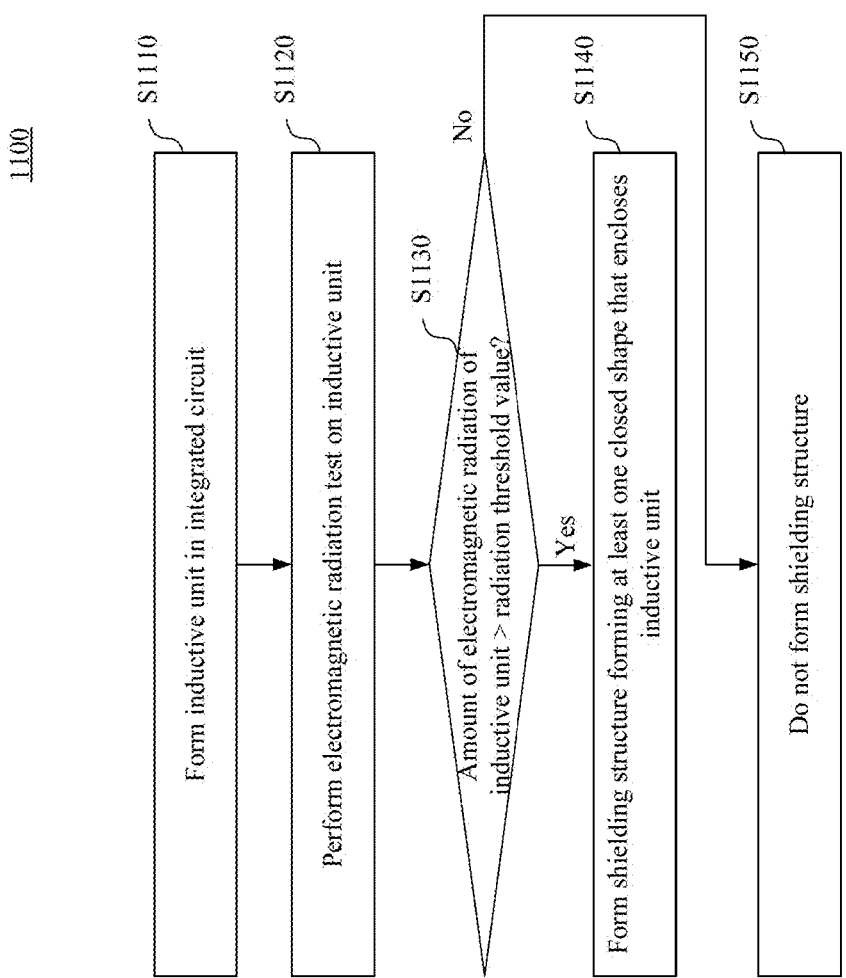
FIG. 11 is a flow chart of an inductive device manufacturing method in an embodiment of the present invention.

FIG. 11 is a flow chart of an inductive device manufacturing method 1100 in an embodiment of the present invention.

Besides the system described above, the present invention further provides the inductive device manufacturing method 1100 that can be used in manufacturing the inductive unit 700 in FIG. 7. As illustrated in FIG. 11, an embodiment of the inductive device manufacturing method 1100 includes the following steps.

In step S1110, the inductive unit 710 is formed in an integrated circuit.

In step S1120, an electromagnetic radiation test is performed on the inductive unit 710.

In step S1130, whether an amount of electromagnetic radiation related to the inductive unit 710 exceeds a radiation threshold value is determined. The electromagnetic radiation can be generated by either the inductive unit 710 or by external circuit components.

In step S1140, when the amount of electromagnetic radiation of the inductive unit 710 exceeds the radiation threshold value, the shielding structure 720 forming at least one closed shape that encloses the inductive unit 710 is formed.

The shielding structure 720 has the width thereof and the distance separated from the inductive unit such that the decreasing amount of the quality factor of the inductive unit is not larger than the first predetermined value and a shielded amount of electromagnetic radiation is not lower than the second predetermined value.

In step S1150, when the amount of electromagnetic radiation of the inductive unit 710 does not exceed the radiation threshold value, the shielding structure 720 is not formed.

It is appreciated that the embodiments described above are merely an example. In other embodiments, it should be appreciated that many modifications and changes may be made by those of ordinary skill in the art without departing, from the spirit of the invention.

In summary, the inductive device having electromagnetic radiation shielding mechanism and the inductive device manufacturing method of the present invention prevents the inductive unit thereof from the effect of the electromagnetic radiation without impacting the operation of the inductive unit.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An inductive device having electromagnetic radiation shielding mechanism, comprising:
   an inductive unit; and
   a shielding structure forming at least one closed shape that encloses the inductive unit;
   wherein the shielding structure has a width thereof and a distance separated from the inductive unit such that a decreasing amount of a quality factor of the inductive unit is not larger than a first predetermined value and a shielded amount of electromagnetic radiation is not lower than a second predetermined value;
   wherein the inductive unit has a symmetric shape and the inductive device further comprises a single asymmetric inductive portion electrically coupled to the inductive unit, and the closed shape of the shielding structure is formed to enclose the inductive unit and cover the single asymmetric inductive portion;
   wherein at least a part of the single asymmetric inductive portion extends along a peripheral direction of the shielding structure.

2. The inductive device of claim 1, wherein the shielding structure is formed in a same circuit layer and either in a same plane that the inductive unit is disposed or above the plane that the inductive unit is disposed.

3. The inductive device of claim 1, wherein the shielding structure and the inductive unit are formed in different circuit layers.

4. The inductive device of claim 1, wherein the width of the shielding structure ranges from 3 micrometers to 8 micrometers and the distance ranges from 15 micrometers to 20 micrometers.

5. The inductive device of claim 1, wherein the inductive unit has a symmetric shape and the inductive device further comprises an asymmetric inductive portion electrically coupled to the inductive unit, and the closed shape of the shielding structure is formed to enclose the inductive unit and cover the asymmetric inductive portion.

6. The inductive device of claim 1, wherein the inductive unit has a symmetric shape and the inductive device further comprises an asymmetric inductive portion electrically coupled to the inductive unit, and the closed shape of the shielding structure is formed to enclose the inductive unit and keep the asymmetric inductive portion outside of the closed shape.

7. The inductive device of claim 1, wherein the inductive unit is a voltage control oscillator (VCO) or a power amplifier.

8. The inductive device of claim 1, wherein the shielding structure is either electrically isolated or electrically coupled to a ground level.

9. The inductive device of claim 1, wherein the shielding structure either prevents the inductive unit from being affected by an external electromagnetic radiation or prevents an internal electromagnetic radiation generated by the inductive unit from leaking out.

10. The inductive device of claim 1, wherein the shielding structure comprises at least two shielding units each forming the closed shape.

11. The inductive device of claim 1, wherein the inductive unit comprises a first inductor and a second inductor, comprising:
    a first helical coil, comprising a first outer coil and a first inner coil, the first inner coil being located inside the first outer coil;
    a second helical coil, sharing an overlapped region with the first helical coil, comprising a second outer coil and a second inner coil, the second inner coil being located inside the second outer coil; and
    a connecting structure, connecting the first helical coil and the second helical coil;
    wherein, the first inductor comprises a part of the first helical coil and a part of the second helical coil, and the second inductor comprises a part of the first helical coil and a part of the second helical coil.

* * * * *